United States Patent
Tamura

(10) Patent No.: US 8,741,721 B2
(45) Date of Patent: Jun. 3, 2014

(54) SEMICONDUCTOR DEVICE AND MANUFACTURING METHOD THEREOF

(75) Inventor: Naoyoshi Tamura, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/109,126

(22) Filed: May 17, 2011

(65) Prior Publication Data

US 2011/0217847 A1 Sep. 8, 2011

Related U.S. Application Data

(62) Division of application No. 11/652,131, filed on Jan. 11, 2007, now Pat. No. 7,968,920.

(30) Foreign Application Priority Data

Oct. 12, 2006 (JP) ................................. 2006-278448

(51) Int. Cl.
*H01L 21/31* (2006.01)
(52) U.S. Cl.
USPC ........... 438/292; 438/401; 438/901; 438/369; 438/303; 438/153; 257/288; 257/401; 257/369; 257/E21.223; 257/E21.106
(58) Field of Classification Search
USPC .......... 438/292, 401, 901, 369; 257/288, 401, 257/369, E21.106, E21.223
See application file for complete search history.

(56) References Cited

U.S. PATENT DOCUMENTS

| | | | |
|---|---|---|---|
| 7,202,120 B2 | 4/2007 | Shima et al. | |
| 2004/0075148 A1 | 4/2004 | Kumagai et al. | |
| 2005/0161823 A1 | 7/2005 | Jobetto et al. | |
| 2005/0167748 A1 | 8/2005 | Onda et al. | |
| 2006/0118892 A1 | 6/2006 | Wu et al. | |
| 2006/0186557 A1* | 8/2006 | Shima et al. | 257/900 |
| 2006/0189053 A1* | 8/2006 | Wang et al. | 438/197 |
| 2007/0132032 A1 | 6/2007 | Teo et al. | |

(Continued)

FOREIGN PATENT DOCUMENTS

| | | |
|---|---|---|
| JP | 2003-86708 A | 3/2003 |
| JP | 2005-005633 A | 1/2005 |

(Continued)

OTHER PUBLICATIONS

Japanese Office Action dated Jun. 5, 2012, issued in corresponding Japanese Patent Application No. 2006-278448, (4 pages), with partial translation.

(Continued)

*Primary Examiner* — Cathy N Lam
(74) *Attorney, Agent, or Firm* — Westerman, Hattori, Daniels & Adrian, LLP

(57) ABSTRACT

A semiconductor device and manufacturing method thereof capable of improving an operating speed of a MOSFET using an inexpensive structure. The method comprises the steps of forming a stress film to cover a source, drain, sidewall insulating layer and gate of the MOSFET and forming in the stress film a slit extending from the stress film surface toward the sidewall insulating layer. As a result, an effect of allowing local stress components in the stress films on the source and the drain to be relaxed by local stress components in the stress film on the gate is suppressed by the slit.

8 Claims, 19 Drawing Sheets

(56) References Cited

U.S. PATENT DOCUMENTS

| | | | |
|---|---|---|---|
| 2007/0161244 A1 | 7/2007 | Greene et al. | |
| 2007/0200179 A1 | 8/2007 | Chen | |
| 2007/0235823 A1* | 10/2007 | Hsu et al. | 257/411 |
| 2010/0096673 A1* | 4/2010 | Chen et al. | 257/288 |
| 2011/0121325 A1* | 5/2011 | Zhang et al. | 257/88 |

FOREIGN PATENT DOCUMENTS

| | | |
|---|---|---|
| JP | 2006-237263 A | 9/2006 |
| TW | I254452 | 10/1993 |
| TW | I253743 | 1/1994 |
| TW | I259533 | 10/1994 |

OTHER PUBLICATIONS

Taiwanese Office Action dated Jul. 2, 2010, issued in corresponding Taiwanese Patent Application No. 096102439.

Charles S. Smith, "Piezoresistance Effect in Germanium and Silicon", Physical Review, vol. 94, No. 1, p. 42-49.

Y C Liu et al., "Single Street Liner for Both NMOS and PMOS Current Enhancement by a Novel Ultimate Spacer Process", IEEE Transactions.

* cited by examiner

| Channel direction | Stress direction | $\pi_{LONG}$ $\pi_{TRANS}$ $\pi_{PERP}$ | PR coefficient ($\times 10^{-12} cm^2/dyn$) | |
|---|---|---|---|---|
| | | | n-type@11.7$\Omega$cm | p-type@7.8$\Omega$cm |
| <110> | <110> | $(\pi_{11}+\pi_{12}+\pi_{44})/2$ | -31.2 | 71.8 |
| | <1$\bar{1}$0> | $(\pi_{11}+\pi_{12}-\pi_{44})/2$ | -17.6 | -66.3 |
| | <001> | $\pi_{12}$ | 53.4 | -1.1 |
| <100> | <100> | $\pi_{11}$ | -102.2 | 6.6 |
| | <010> | $\pi_{12}$ | 53.4 | -1.1 |
| | <001> | $\pi_{12}$ | 53.4 | -1.1 |

| N-CHANNEL MOSFET | $\sigma_{LONG}[dyn/cm^2]$ | $\sigma_{PERP}[dyn/cm^2]$ | $\Delta\mu/\mu_0(\%)$ |
|---|---|---|---|
| WITH SLIT | 2.55E+10 | -9.3E+09 | 73.38 |
| WITHOUT SLIT | 7.6E+09 | -9E+09 | 16.02 |

FIG. 18B

| P-CHANNEL MOSFET | $\sigma_{LONG}[dyn/cm^2]$ | $\sigma_{PERP}[dyn/cm^2]$ | $\Delta\mu/\mu_0(\%)$ |
|---|---|---|---|
| WITH SLIT | -2.5E+10 | 4.54E+09 | 119.06 |
| WITHOUT SLIT | -1.2E+10 | 6.63E+09 | 28.38 |

SEMICONDUCTOR DEVICE AND MANUFACTURING METHOD THEREOF

CROSS-REFERENCE TO RELATED APPLICATIONS

This application is a divisional of U.S. application Ser. No. 11/652,131 filed Jan. 11, 2007, which is based upon and claims the benefits of priority from the prior Japanese Patent Application No. 2006-278448, filed on Oct. 12, 2006, the entire contents of which are incorporated herein by reference.

BACKGROUND OF THE INVENTION

1. Field of the Invention

The present invention relates to a semiconductor device and a method for manufacturing the semiconductor device. More particularly, the present invention relates to a semiconductor device having a Metal-Oxide Semiconductor (MOS) field-effect transistor. The invention also pertains to a method for manufacturing the semiconductor device.

2. Description of the Related Art

For one technique for speeding up an operating speed of a MOS field-effect transistor (hereinafter, referred to as a MOSFET), a "strain technique" for applying a predetermined stress to a channel and imparting a strain to a channel crystal to thereby improve a channel mobility of carriers is being taken notice of.

Examples of the technique for applying a stress to a channel portion include a technique for changing a material filled within a Shallow Trench Isolation (STI) as an element isolation region to change a stress applied to a channel, a technique for embedding a material having a lattice constant different from that of a silicon substrate into a source region or a drain region to apply a stress to a channel, and a technique for forming a silicide on a source region or a drain region to apply a stress to a channel by a thermal expansion difference between the silicide and a silicon substrate.

In addition, examples thereof include a technique for covering the MOSFET with a Contact Etching Stop Liner film (hereinafter, referred to as a CESL film) to apply a stress to a channel using a intrinsic stress of the CESL film. According to this technique, a stress can be inexpensively applied to a channel.

For an example using such a stress film, for example, Japanese Unexamined Patent Publication No. 2005-5633 discloses a semiconductor device in which a stress film is formed on a source region and a drain region to apply a stress to a channel.

In the case of the Complementary MOS (CMOS) structure, when a stress is applied to the n-channel MOSFET to stretch the whole channel as well as applied to the p-channel MOSFET to compress the whole channel in the source-drain direction, each channel mobility of carriers can be improved.

However, the speeding up of the MOSFET is further requested recently. Therefore, it becomes difficult to apply a sufficient strain to a channel by individually applying the above-described techniques.

In addition, it is needed to simply and effectively apply a stress to a channel in order to suppress process costs.

In terms of costs, the above-described technique for covering the MOSFET with the CESL film is preferred. However, when a intrinsic stress of a film is excessively increased in order to apply a higher stress to a channel, a warpage occurs in a wafer itself. As a result, it becomes difficult to perform a lithography process of forming a pattern. Accordingly, there are limitations in improving the intrinsic stress of a film.

Therefore, plural techniques must be heretofore used at the same time to improve the stress applied to a channel. However, this case has a problem that the process costs more increase.

SUMMARY OF THE INVENTION

In view of the foregoing, it is an object of the present invention to provide a semiconductor device and manufacturing method thereof capable of improving an operating speed of a MOSFET using an inexpensive structure.

To accomplish the above objects, according to the present invention, there is provided a semiconductor device having a MOS field-effect transistor. This semiconductor device comprises: a stress film formed to cover a source, a drain, a sidewall insulating layer and a gate, wherein a slit extending from a surface of the stress film toward the sidewall insulating layer is formed in the stress film.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 6 shows one example of a piezoresistance coefficient.

FIGS. 18A and 18B are results obtained by comparing the mobility improvement effect between the stress film in which a slit is formed and the stress film in which no slit is formed.

DESCRIPTION OF THE PREFERRED EMBODIMENTS

Figure 1:
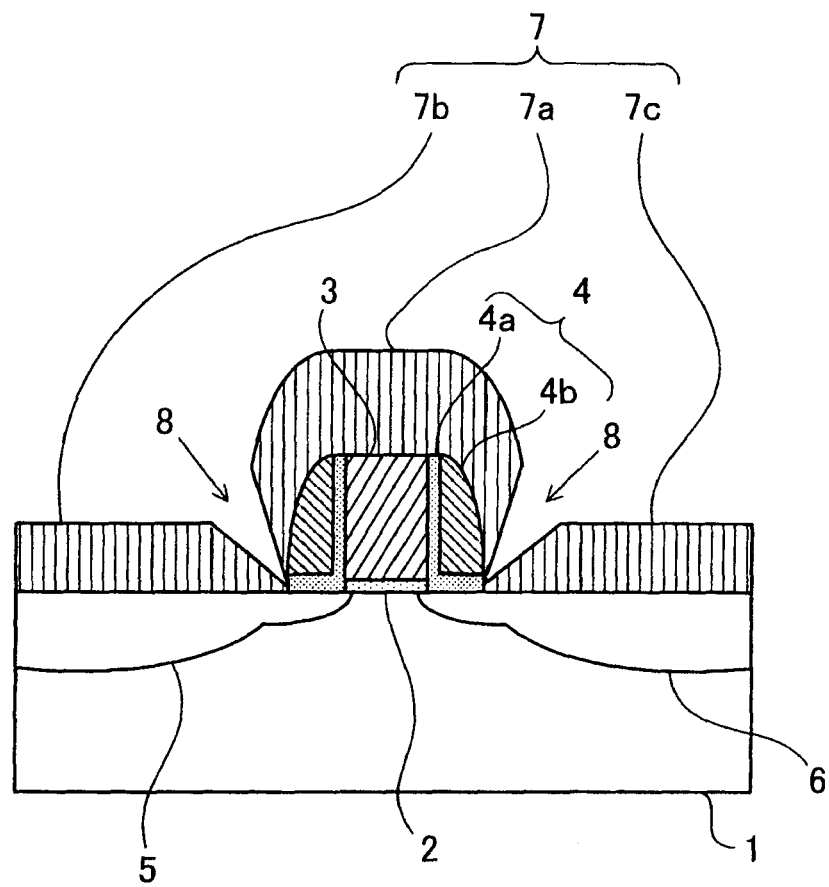
FIG. 1 is a cross-sectional view showing a schematic structure of a semiconductor device according to the present embodiment.

Preferred embodiments of the present invention will be described below with reference to the accompanying drawings, wherein like reference numerals refer to like elements throughout.

FIG. 1 is a cross-sectional view showing a schematic structure of a semiconductor device according to the present embodiment.

The semiconductor device according to the present embodiment has a MOSFET. In a gate portion of the MOSFET, a gate oxide film 2 is formed on a semiconductor substrate and on the film 2, a polycrystalline silicon gate electrode 3 is formed. On each sidewall of the polycrystalline silicon gate electrode 3, a sidewall insulating layer 4 made of a silicon oxide film 4a and a silicon nitride film 4b is formed. In the semiconductor substrate 1, a source 5 and a drain 6 are formed. Further, a stress film 7 is formed to cover the source 5, the drain 6 and the gate. For the stress film 7, for example, a CESL film is used. In the case where the MOSFET is an n-channel MOSFET, the stress film 7 having a tensile intrinsic stress is used. In the case where the MOSFET is a p-channel MOSFET, the stress film 7 having a compressive intrinsic stress is used.

In the semiconductor device according to the present embodiment, a slit 8 extending from the stress film 7 surface toward the sidewall insulating layer 4 of the gate is formed in the stress film 7. Herein, the slit 8 is formed to extend toward a source 5 side end and drain 6 side end of the sidewall insulating layer 4.

The slit 8 herein said includes a slit that completely separates among a stress film 7a on the gate, a stress film 7b on the source 5 and a stress film 7c on the drain 6 as well as a slit that incompletely separates among these films.

Figure 2A:
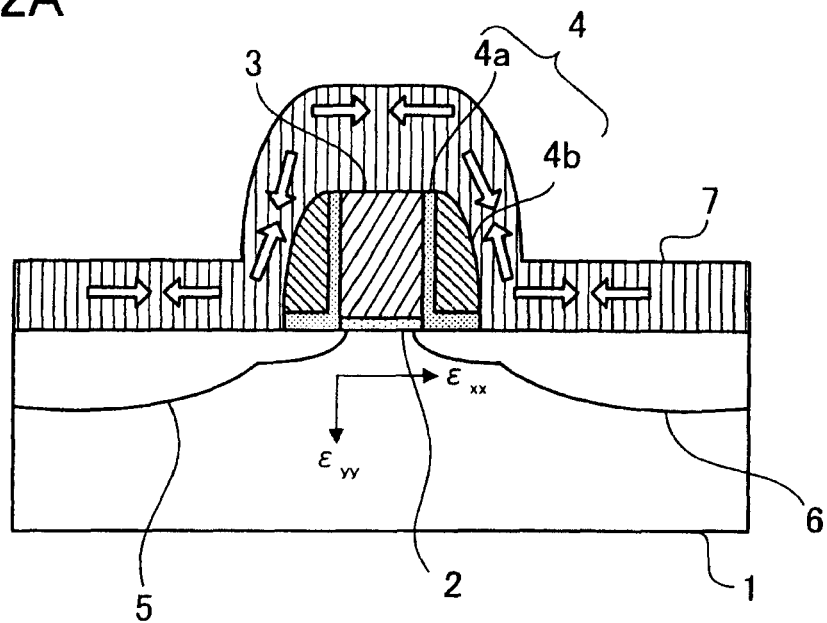
FIGS. 2A and 2B show a behavior of stress components on a MOSFET in the case of using a stress film having a tensile intrinsic stress.
Figure 2B:
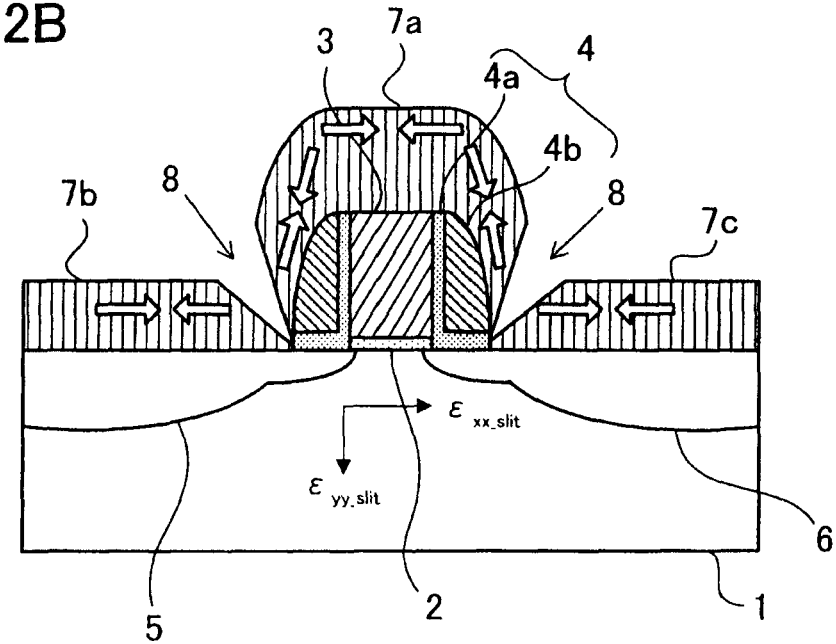

FIGS. 2A and 2B show a behavior of stress components on the MOSFET in the case of using a stress film having a tensile intrinsic stress. FIG. 2A shows a behavior of stress components in the case of using a conventional stress film in which no slit is formed. FIG. 2B shows a behavior of stress components in the case of using the stress film of the present invention in which a slit is formed.

The stress film 7 having a tensile intrinsic stress is in itself a shrunk film. Therefore, by the shrinkage of the stress film 7 on the source 5 and the drain 6, a tensile strain in the source-drain direction is induced in the channel.

However, in the case where no slit is formed in the stress film 7 as shown in FIG. 2A, local shrunk components in the stress film 7 on the source 5 and the drain 6 are relaxed by shrunk components on the gate among local shrunk components in the stress film 7. As a result, a sufficient tensile strain is unable to be induced in the channel.

On the other hand, in the case where the slit 8 extending from the stress film 7 surface toward the sidewall insulating layer 4 of the gate is formed as shown in FIG. 2B, local shrunk components in the stress film 7a on the gate and local shrunk components in the stress films 7b and 7c on the source 5 and the drain 6 are separated. As a result, the shrunk components in the stress films 7b and 7c on the source 5 and the drain 6 can be prevented from being relaxed. Therefore, a sufficient tensile strain can be induced in the channel.

Figure 3:
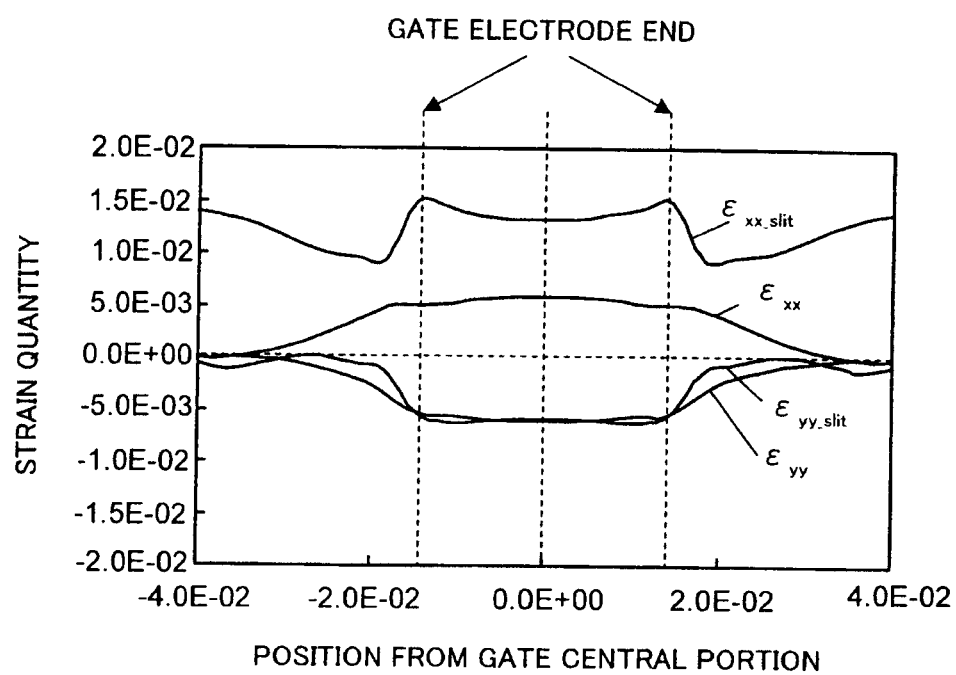
FIG. 3 is FEM (Finite Element Method) simulation results for a strain component in the case of using a stress film having a tensile intrinsic stress.

FIG. 3 is FEM (Finite Element Method) simulation results for a strain component in the case of using a stress film having a tensile intrinsic stress.

Herein, FIG. 3 shows the strain component $\epsilon_{xx}$ in the source-drain direction and the strain component $\epsilon_{yy}$ in the channel depth direction of the semiconductor device in which no slit is formed in the stress film 7 as shown in FIG. 2A. At the same time, FIG. 3 shows the strain component $\epsilon_{xx\_slit}$ in the source-drain direction and the strain component $\epsilon_{yy\_slit}$ in the channel depth direction of the semiconductor device in which a slit 8 is formed in the stress film 7 as shown in FIG. 2B. Further, a positive strain shows a tensile strain and a negative strain shows a compressive strain.

As shown in the figure, the semiconductor device in which the slit 8 is formed can increase a tensile strain in the source-drain direction without deteriorating a compressive strain in the channel depth direction, as compared with the semiconductor device in which no slit 8 is formed.

Figure 4A:
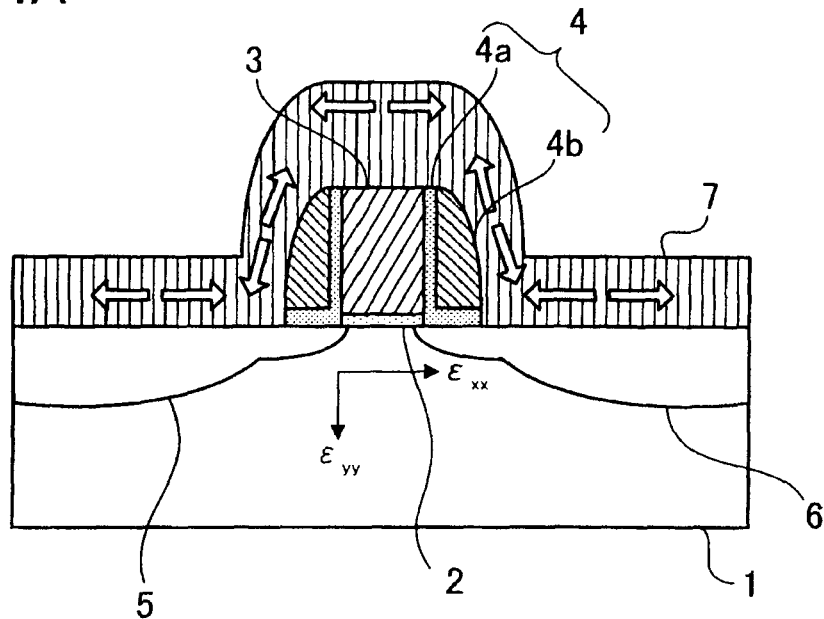
FIGS. 4A and 4B show a behavior of stress components on the MOSFET in the case of using a stress film having a compressive intrinsic stress.
Figure 4B:
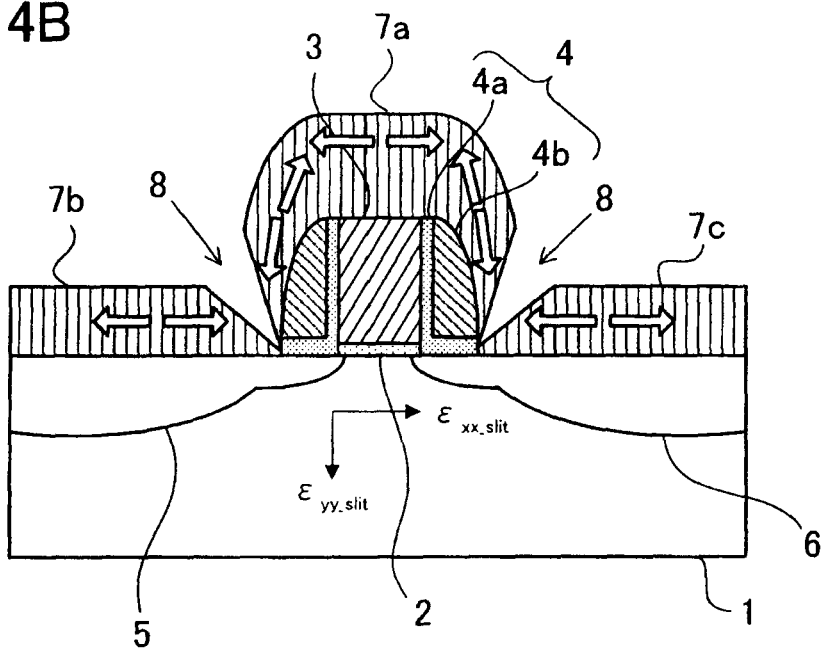

FIGS. 4A and 4B show a behavior of stress components on the MOSFET in the case of using a stress film having a compressive intrinsic stress. FIG. 4A shows a behavior of stress components in the case of using a conventional stress film in which no slit is formed. FIG. 4B shows a behavior of stress components in the case of using the stress film of the present invention in which a slit is formed.

The stress film 7 having a compressive intrinsic stress is in itself an extensible film. Therefore, by the tension in the stress film 7 on the source 5 and the drain 6, a compressive strain in the source-drain direction is induced in the channel.

However, in the case where no slit is formed in the stress film 7 as shown in FIG. 4A, local tensile components in the stress film 7 on the source 5 and the drain 6 are relaxed by tensile components on the gate among local tensile components in the stress film 7. As a result, a sufficient compressive strain is unable to be induced in the channel.

On the other hand, in the case where the slit 8 extending from the stress film 7 surface toward the sidewall insulating layer 4 of the gate is formed as shown in FIG. 4B, local tensile components in the stress film 7a on the gate and local tensile components in the stress films 7b and 7c on the source 5 and the drain 6 are separated. As a result, the tensile components in the stress films 7b and 7c on the source 5 and the drain 6 can be prevented from being relaxed. Therefore, a sufficient compressive strain can be induced in the channel.

Figure 5:
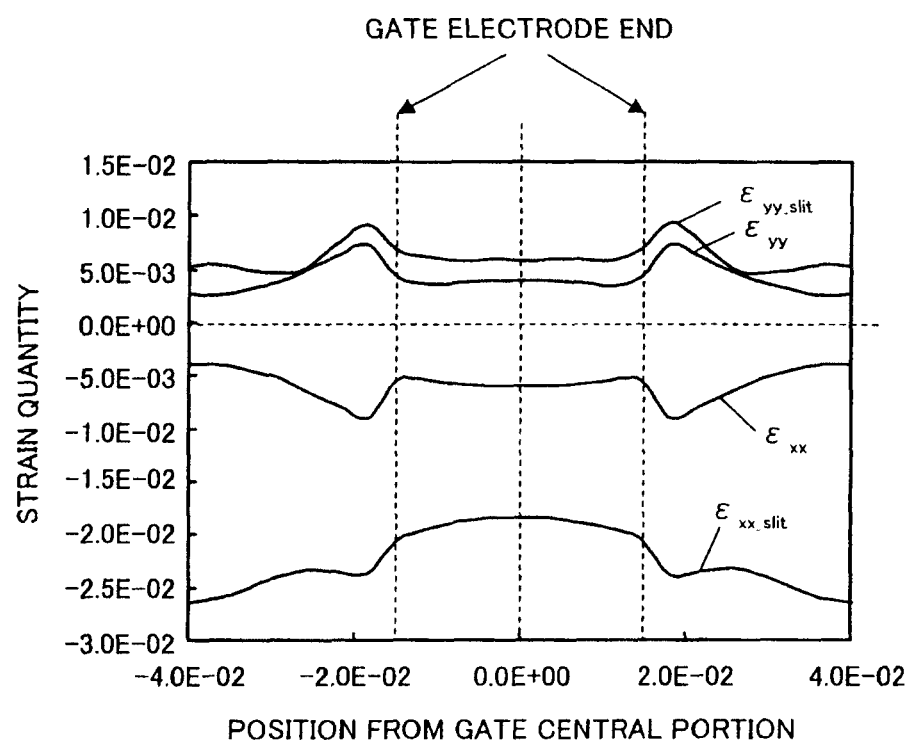
FIG. 5 is FEM simulation results for a strain component in the case of using a stress film having a compressive intrinsic stress.

FIG. 5 is FEM simulation results for a strain component in the case of using a stress film having a compressive intrinsic stress.

Herein, FIG. 5 shows the strain component $\epsilon_{xx}$ in the source-drain direction and the strain component $\epsilon_{yy}$ in the channel depth direction of the semiconductor device in which no slit is formed in the stress film 7 as shown in FIG. 4A. At the same time, FIG. 5 shows the strain component $\epsilon_{xx\_slit}$ in the source-drain direction and the strain component $\epsilon_{yy\_slit}$ in the channel depth direction of the semiconductor device in which a slit 8 is formed in the stress film 7 as shown in FIG. 4B.

As shown in the figure, the semiconductor device in which the slit 8 is formed can increase a compressive strain in the source-drain direction without deteriorating a compressive strain in the channel depth direction, as compared with the semiconductor device in which no slit 8 is formed.

The ratio between the mobility $\mu_0$ in the case of no addition of strains to the channel and a changed portion $\Delta\mu$ in the mobility due to the addition of strains to the channel is approximately represented by the following formula.

$$\Delta\mu/\mu_0 \approx |\pi_{LONG} \times \sigma_{LONG} + \pi_{PERP} \times \sigma_{PERP}| \quad (1)$$

Herein, $\pi_{LONG}$ is a piezoresistance coefficient to a stress in the source-drain direction (changed sensitivity of the strain component to the resistivity) and $\sigma_{LONG}$ is a stress in the source-drain direction of the channel. Further, $\pi_{PERP}$ is a piezoresistance coefficient to a stress in the channel depth direction and $\sigma_{PERP}$ is a stress in the channel depth direction.

The piezoresistance coefficient on a silicon substrate surface differs depending on the channel and stress directions.

FIG. 6 shows one example of the piezoresistance coefficient.

Herein, FIG. 6 shows an example in which by referring to C. S. Smith, Phys. Rev. 94, 42 (1954), the piezoresistance coefficients (PR coefficients) are calculated in the cases where channel directions are the <110> and <100> directions. $\pi_{11}$, $\pi_{12}$ and $\pi_{44}$ are the piezoresistance coefficients in the case where the crystal axis and stress axis of a silicon (100) substrate coincide with each other.

In the case where a channel direction is the <110> direction, the piezoresistance coefficient $\pi_{LONG}$ to the stress in the source-drain direction (<110> direction) is represented by $(\pi_{11}+\pi_{12}+\pi_{44})/2$ using $\pi_{11}$, $\pi_{12}$ and $\pi_{44}$. Further, the piezoresistance coefficient $\pi_{TRANS}$ in the <1-10> direction is represented by $(\pi_{11}+\pi_{12}-\pi_{44})/2$ using $\pi_{11}$, $\pi_{12}$ and $\pi_{44}$. Further, the piezoresistance coefficient $\pi_{PERP}$ in the channel depth direction (<001> direction) is represented by $\pi_{12}$.

On the other hand, in the case where a channel direction is the <100> direction, the piezoresistance coefficient $\pi_{LONG}$ to the stress in the source-drain direction (<100> direction) is represented by $\pi_{11}$. Further, the piezoresistance coefficient in the <010> direction $\pi_{TRANS}$ is represented by $\pi_{12}$. Further, the piezoresistance coefficient $\pi_{PERP}$ in the channel depth direction (<001> direction) is also represented by $\pi_{12}$.

FIG. 6 shows the piezoresistance coefficients $\pi_{LONG}$, $\pi_{TRANS}$, $\pi_{PERP}$ for each of the n-channel MOSFET (resistivity: 11.7 Ωcm) and the p-channel MOSFET (resistivity: 7.8 Ωcm).

From formula (1), it is understood that in order to increase the mobility of carriers, the stress $\sigma_{LONG}$ in the source-drain direction or the stress $\sigma_{PERP}$ in the channel depth direction must be improved. In the n-channel MOSFET, a value of the piezoresistance coefficient $\pi_{PERP}$ in the channel depth direction is as large as 53.4 and therefore, it is effective to apply a stress to the channel by the stress film 7 from above the gate.

In the semiconductor device of the present embodiment, the slit 8 is formed in the stress film 7 having a tensile intrinsic stress. As a result, a tensile strain in the source-drain direction can be improved without deteriorating a compressive strain in the channel depth direction as shown in FIG. 3. Thus, the mobility of carriers can be improved. Further, in the case where a channel direction is the <100> direction, a value of the piezoresistance coefficient $\pi_{LONG}$ in the source-drain direction is as large as −102.2 and therefore, the mobility of carriers is particularly effectively improved.

On the other hand, in the p-channel MOSFET, the piezoresistance coefficient $\pi_{LONG}$ in the source-drain direction expresses the largest value as shown in FIG. 6. In the semiconductor device of the present embodiment, the slit 8 is formed in the stress film 7 having a compressive intrinsic stress. As a result, a compressive strain in the source-drain direction can be improved as shown in FIG. 5. Thus, the mobility of carriers can be improved.

The slit 8, when being formed to extend to the source 5 side end or drain 6 side end of the sidewall insulating layer 4 as shown in FIG. 1, has a high effect of separating the local stress components in the stress film 7a on the gate and the local stress components in the stress film 7b on the source 5 as well as in the stress film 7c on the drain 6. However, the slit 8 may not necessarily be formed in the end.

Further, it is known that by reducing the sidewall insulating layer 4 of the gate, the stress film 7 on the source 5 and the drain 6 can be approximated to the channel and as a result, the strain component of the channel can be increased. For example, in Y. C. Liu, et al., IEDM2005, increase in the strain component is attained by using a sidewall insulating layer made of an L-shaped oxide film.

Figure 7:
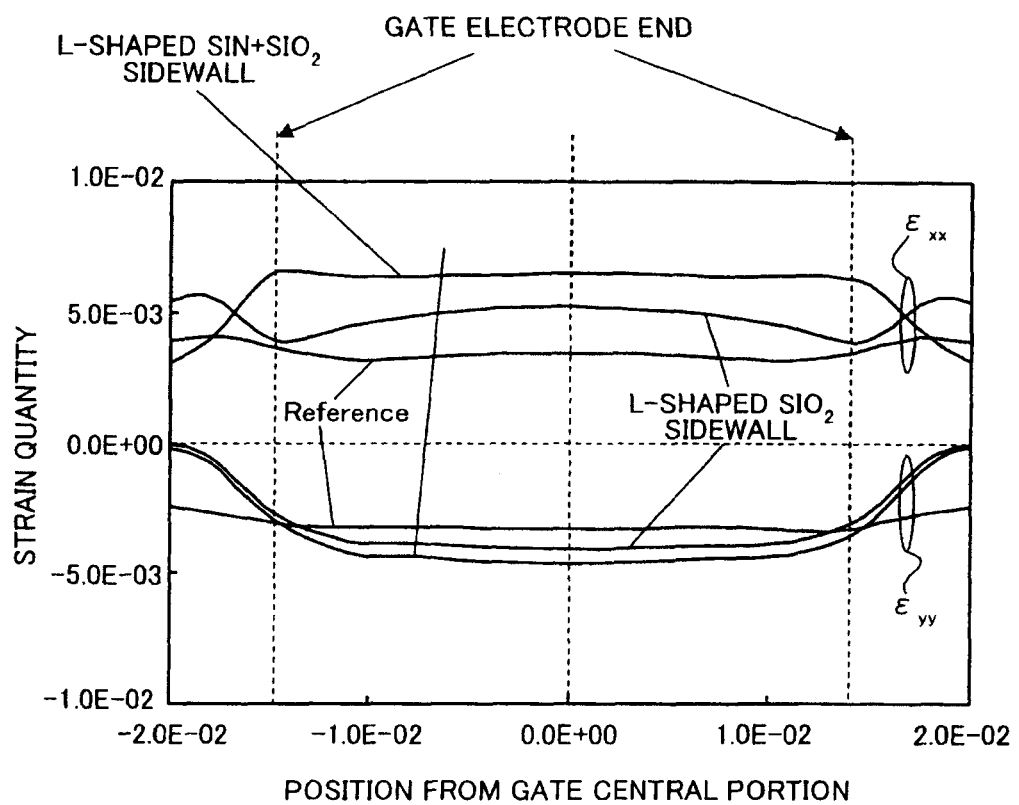
FIG. 7 is FEM simulation results showing differences in a strain component due to differences in a sidewall insulating layer in the case of using a stress film having a tensile intrinsic stress.

FIG. 7 is FEM simulation results showing differences in the strain component due to differences in the sidewall insulating layer, in the case of using a stress film having a tensile intrinsic stress. $\epsilon_{xx}$ is the strain component in the source-drain direction and $\epsilon_{yy}$ is the strain component in the channel depth direction.

Herein, FIG. 7 shows results obtained by estimating using the finite element method the strain component due to differences in the sidewall insulating layer without forming a slit in the stress film. Further, the semiconductor device having the sidewall insulating layer 4 as shown in FIG. 1 is used as a reference.

When the sidewall structure of the gate is composed of an L-shaped oxide film (e.g., film thickness of 7 to 10 nm), the strain component can be increased as compared with the sidewall structure as shown in FIG. 1. Further, when the L-shaped sidewall structure is formed to a double-layered structure composed of a silicon oxide film (e.g., film thickness of 2 nm) and a silicon nitride film (e.g., film thickness of 7 to 10 nm), the strain component can be further increased.

Accordingly, in the semiconductor device having the stress film 7 as shown in FIG. 1 in which the slit 8 is formed, when the sidewall insulating layer 4 having the L-shaped sidewall structure is applied, further improvement in the carrier mobility is allowed (the L-shaped sidewall structure will be described in detail later).

Next, the specific method for manufacturing the semiconductor device according to the present embodiment will be described.

Hereinafter, description will be made taking as an example the manufacturing steps of a CMOSFET.

The following manufacturing condition or film thickness is one example and therefore, the present embodiment is not particularly limited to its value.

FIGS. 8 to 16 show the manufacturing steps of the semiconductor device according to the present embodiment.

Figure 8A:
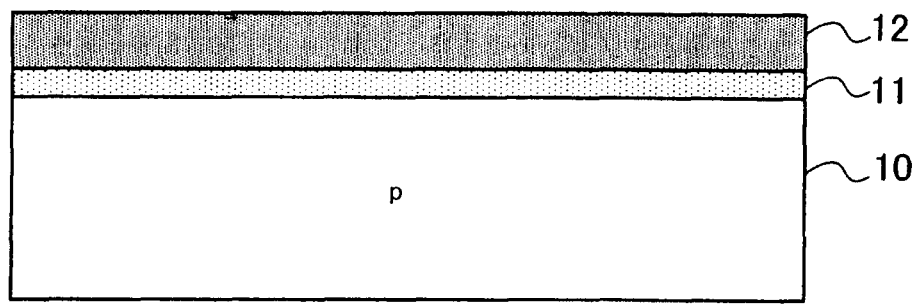
FIGS. 8A, 8B and 8C show the manufacturing steps of the semiconductor device of the present embodiment (part 1).

The steps begin by forming an element isolation region for isolating an n-channel MOSFET and a p-channel MOSFET on a p-type semiconductor substrate 10. First, a silicon oxide film 11 having a thickness of 10 nm is formed on the semiconductor device 10, for example, by dry oxidation at 900° C. On the film 11, a silicon nitride film 12 is deposited to a thickness of 112 nm at 750° C. by a thermal Chemical Vapor Deposition (CVD) method using, for example, dichlorosilane ($SiH_2Cl_2$) and ammonia ($NH_3$) as bases (FIG. 8A).

Figure 8B:
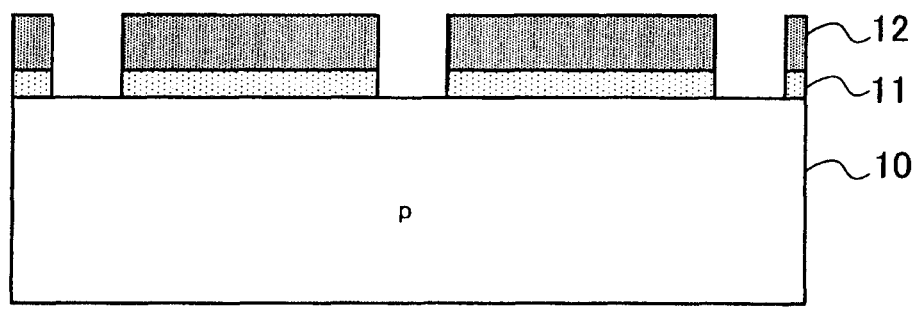
Figure 8C:
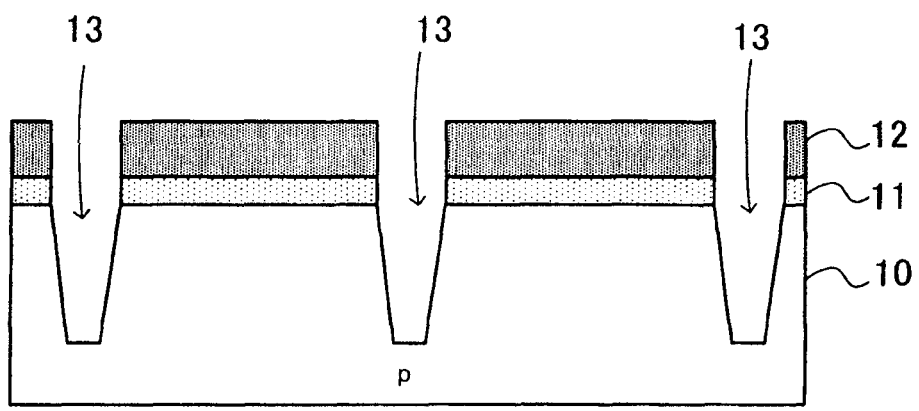

Next, the silicon oxide film 11 and silicon nitride film 12 only in the element isolation region are etched (FIG. 8B). Using as masks the silicon oxide film 11 and the silicon nitride film 12, a groove 13 is formed in the semiconductor substrate 10 (FIG. 8C).

Figure 9A:
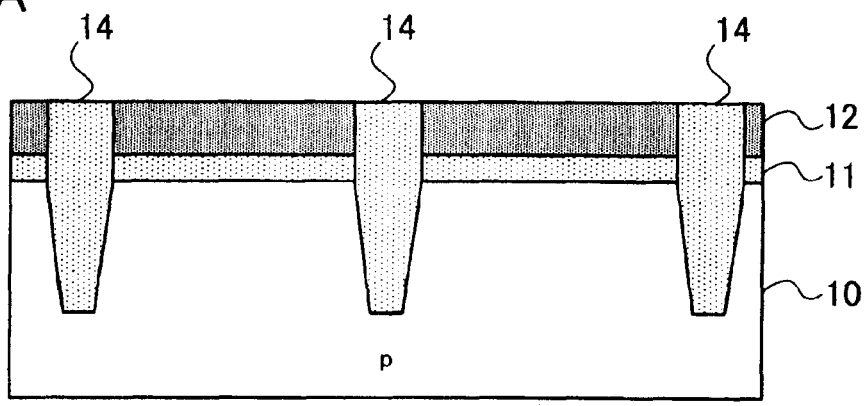
FIGS. 9A, 9B and 9C show the manufacturing steps of the semiconductor device of the present embodiment (part 2).
Figure 9B:
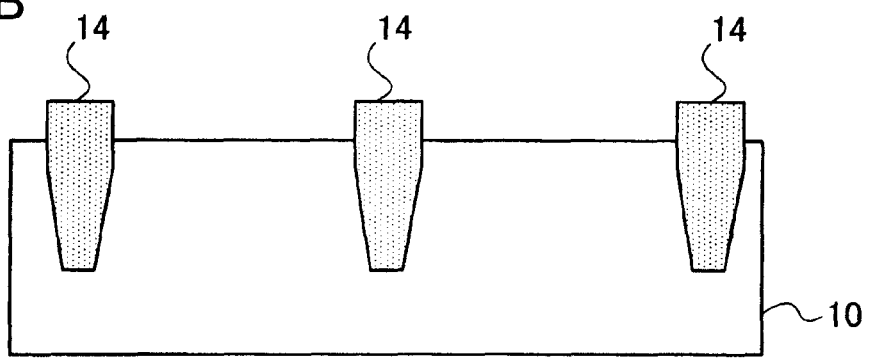
Figure 9C:
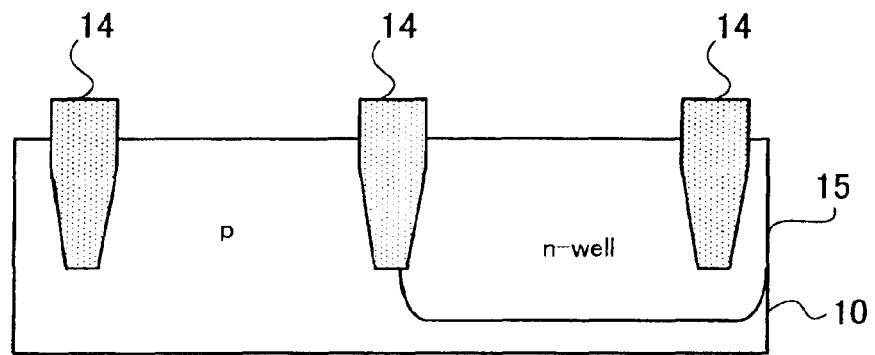

Thereafter, from above the silicon nitride film 12, an insulator such as an oxide film 14 is deposited, for example, by the plasma CVD method and at the same time, filled in the groove 13. Then, the oxide film 14 is polished and flattened using the Chemical Mechanical Polish (CMP) method (FIG. 9A). Further, the silicon nitride film 12 is removed by a wet processing method, for example, using phosphoric acid ($H_3PO_4$) heated to 150° C. Further, the silicon oxide film 11 is removed using hydrofluoric acid (HF) (FIG. 9B). Thereafter, an n-well 15 is formed in the forming region of the p-channel MOSFET (FIG. 9C).

Figure 10A:
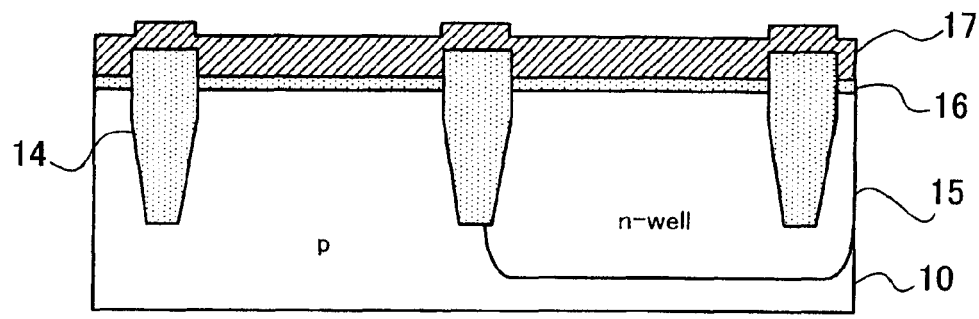
FIGS. 10A, 10B and 10C show the manufacturing steps of the semiconductor device of the present embodiment (part 3).
Figure 10B:
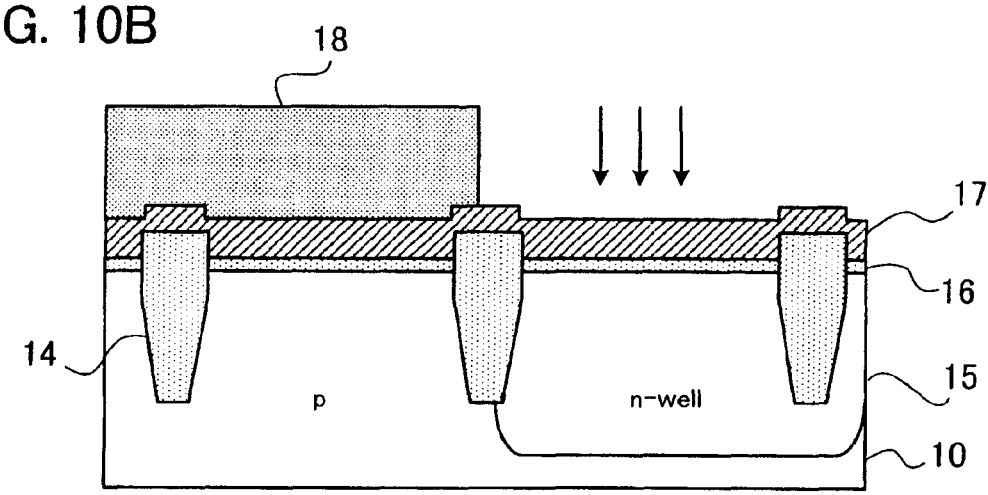
Figure 10C:
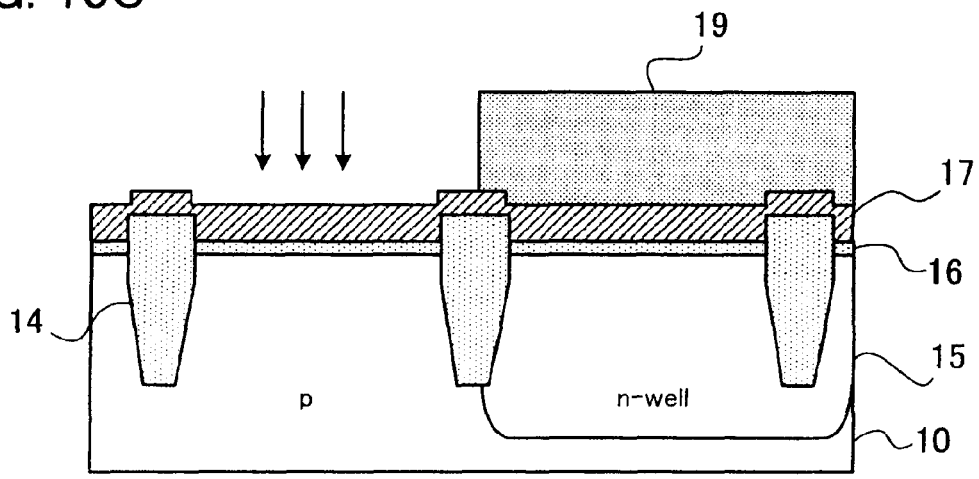

Next, a silicon oxide film 16 having a thickness of about 1.5 nm is formed, for example, by dry oxidation. On the film 16, a polycrystalline silicon layer 17 is deposited, for example, to a thickness of about 100 nm (FIG. 10A). Next, the forming region of the n-channel MOSFET is covered with a photoresist mask 18 and boron (B) is implanted into the polycrystalline silicon layer 17 at a concentration of, for example, $6 \times 10^{15}$ cm$^{-2}$ (FIG. 10B). Then, after removing the photoresist mask 18, the forming region of the p-channel MOSFET is covered with a photoresist mask 19 and phosphorus (P) is implanted into the polycrystalline silicon layer 17 at a concentration of, for example, $8 \times 10^{15}$ cm$^{-2}$ (FIG. 10C).

Figure 11A:
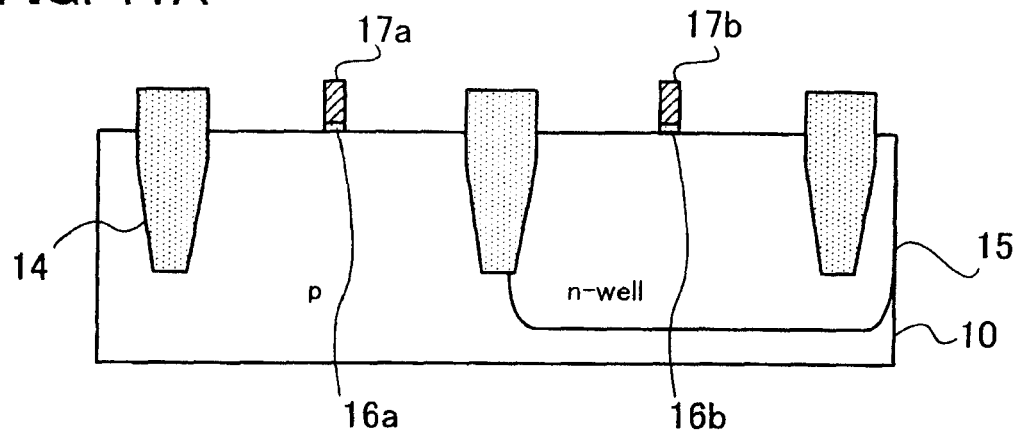
FIGS. 11A, 11B and 11C show the manufacturing steps of the semiconductor device of the present embodiment (part 4).
Figure 11B:
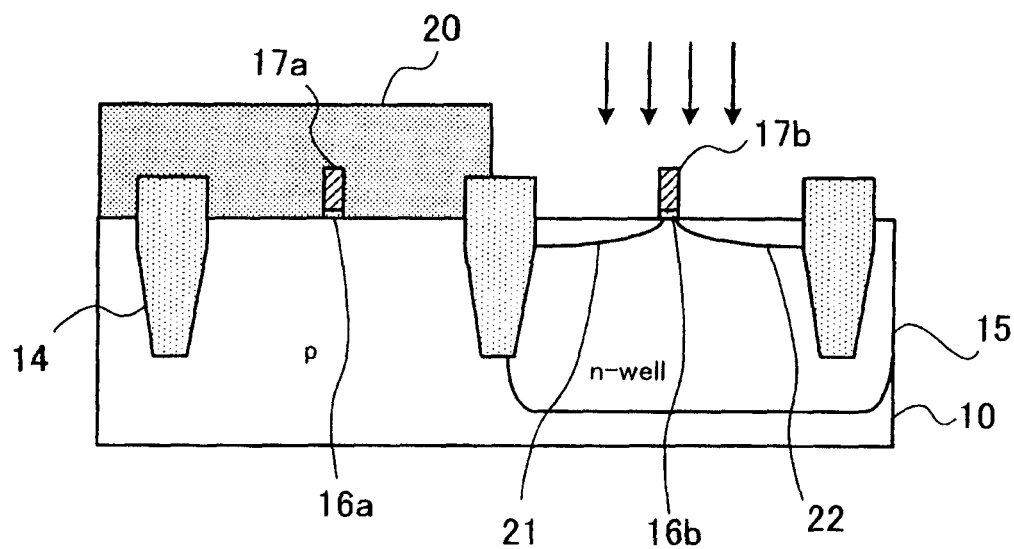
Figure 11C:
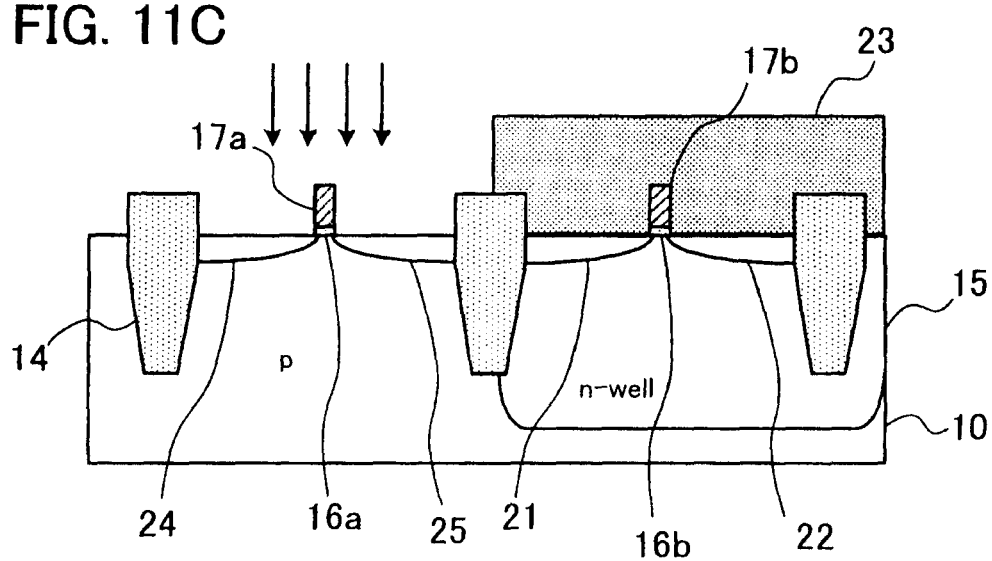

Subsequently, lithography and etching treatment are performed as well as impurities implanted into the polycrystalline silicon layer 17 are activated to form gate oxide films 16a and 16b and polycrystalline silicon gate electrodes 17a and 17b (FIG. 11A). Next, the forming region of the n-channel MOSFET is covered with a photoresist mask 20 and, for example, boron is implanted at 0.5 keV at a concentration of $1 \times 10^{15}$ cm$^{-2}$ to form source and drain extensions 21 and 22 of the p-channel MOSFET (FIG. 11B). Next, after removing the photoresist mask 20, the forming region of the p-channel MOSFET is covered with a photoresist mask 23 and, for example, arsenic (As) is implanted at 3 keV at a concentration of $1 \times 10^{15}$ cm$^{-2}$ to form source and drain extensions 24 and 25 of the n-channel MOSFET (FIG. 11C).

Thereafter, on the sidewalls of the polycrystalline silicon gate electrodes 17a and 17b, the following films are sequentially deposited by the CVD method at a temperature of about 500° C. to 600° C. or less in order to form the above-described L-shaped sidewall insulating layer.

Figure 12A:
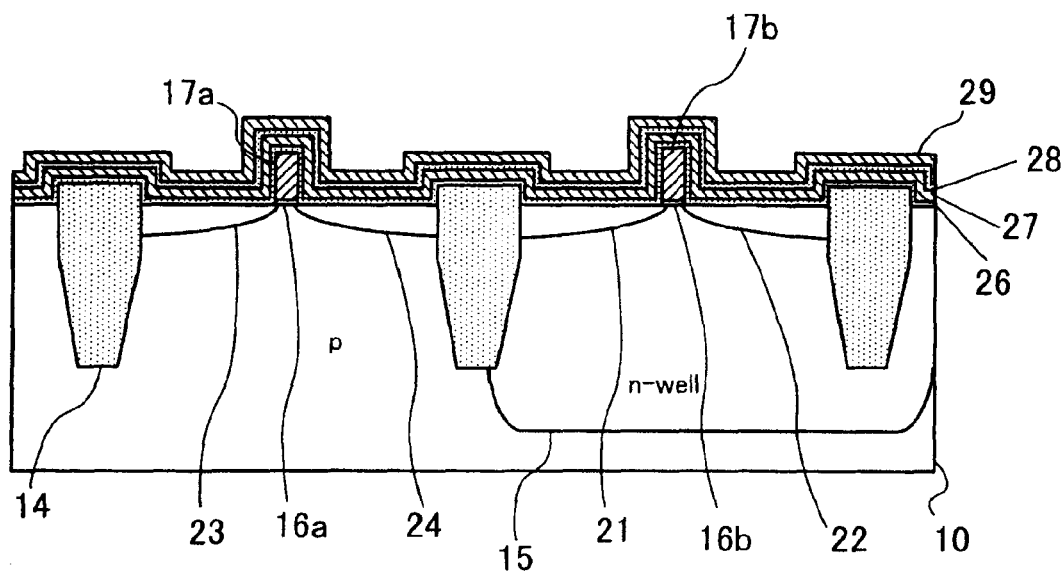
FIGS. 12A and 12B show the manufacturing steps of the semiconductor device of the present embodiment (part 5).
Figure 12B:
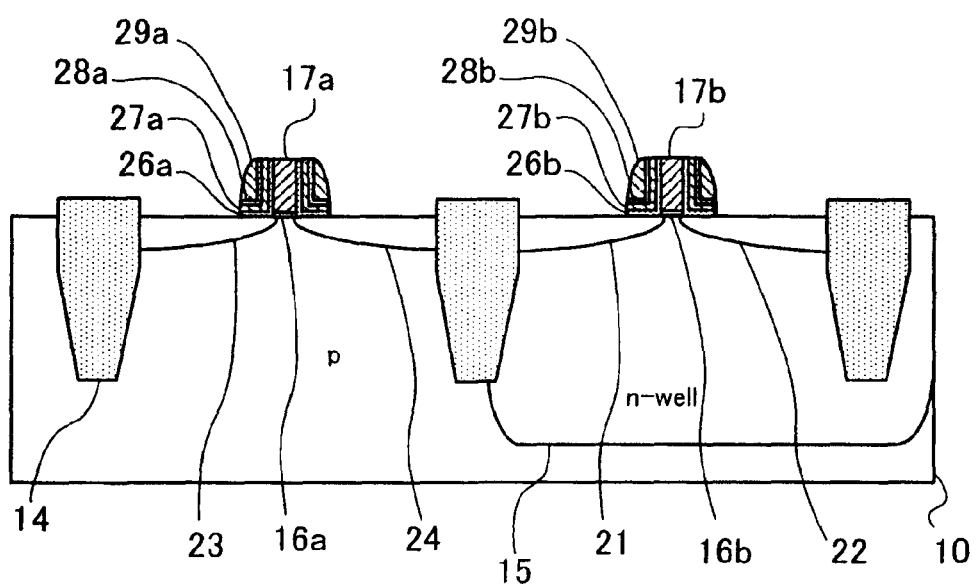

First, a silicon oxide film 26 is deposited, for example, to a thickness of 3 nm. Then, a silicon nitride film 27 is deposited to a thickness of 10 nm. Then, a silicon oxide film 28 is deposited to a thickness of 5 nm. Finally, a silicon nitride film 29 is deposited to a thickness of 20 nm (FIG. 12A). Subsequently, the top silicon nitride film 29 is dry-etched to form sidewall-type silicon nitride films 29a and 29b. Then, the lower silicon oxide film 28 is also dry-etched to form L-shaped silicon oxide films 28a and 28b. Then, the silicon nitride film 27 is similarly dry-etched to form L-shaped silicon nitride films 27a and 27b. Finally, the undermost silicon oxide film 26 is dry-etched to form L-shaped silicon oxide films 26a and 26b (FIG. 12B).

Figure 13A:
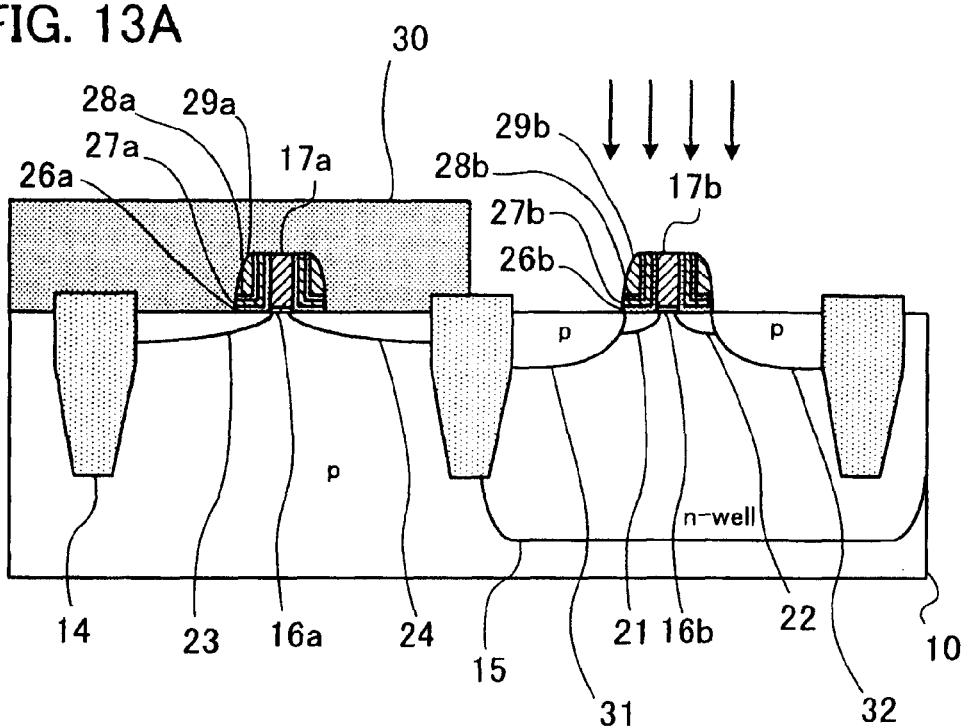
FIGS. 13A and 13B show the manufacturing steps of the semiconductor device of the present embodiment (part 6).
Figure 13B:
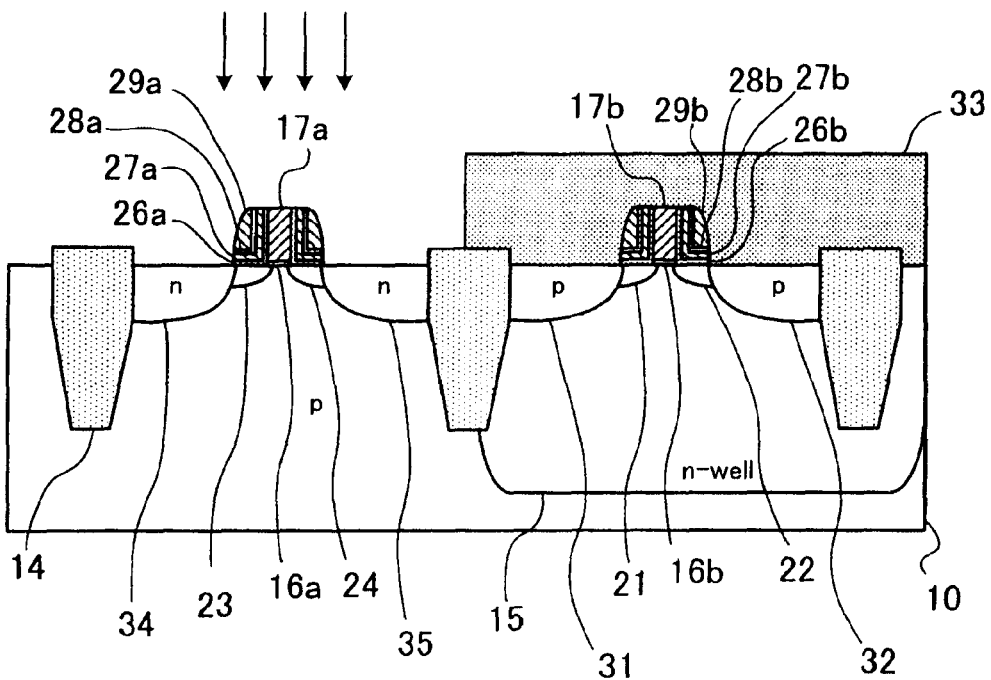

Next, the forming region of the n-channel MOSFET is covered with a photoresist mask 30 and, for example, boron as a p-type impurity is implanted at 3 keV at a concentration of $1 \times 10^{15}$ cm$^{-2}$ to form the drain 31 and source 32 of the p-channel MOSFET (FIG. 13A). Subsequently, the forming region of the p-channel MOSFET is covered with a photoresist mask 33 and, for example, phosphorus (P) as an n-type impurity is implanted at 6 keV at a concentration of $1 \times 10^{16}$ cm$^{-2}$ to form the source 34 and drain 35 of the re-channel MOSFET (FIG. 13B). Thereafter, a Rapid Thermal Process (RTP) is performed, for example, under a nitrogen atmosphere at a temperature of 1000° C. for 10 seconds to activate the implanted impurities.

Figure 14A:
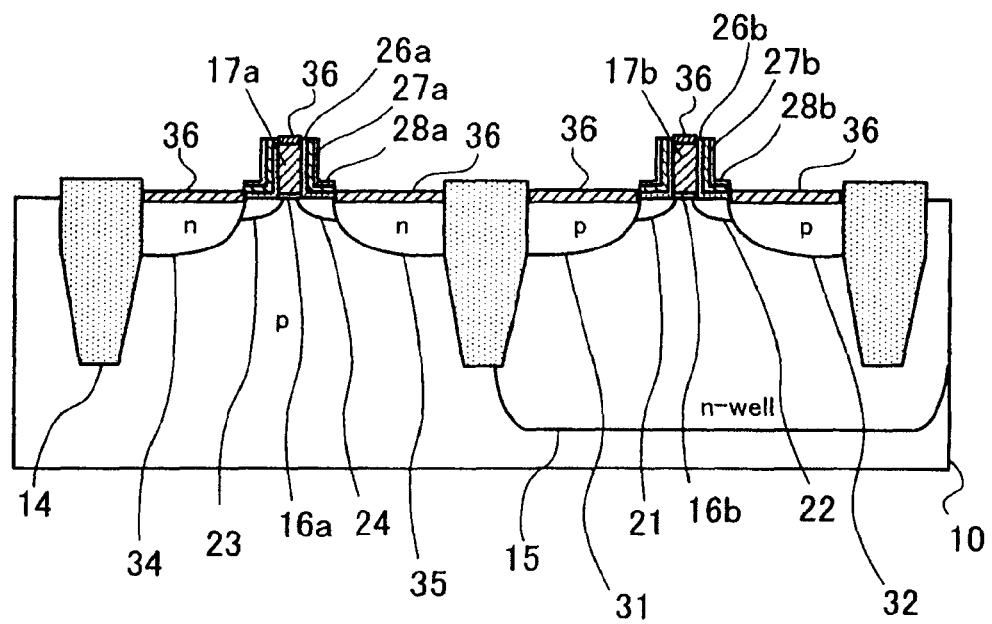
FIGS. 14A and 14B show the manufacturing steps of the semiconductor device of the present embodiment (part 7).

Next, nickel silicide 36 is formed on the sources 32 and 34, the drains 31 and 35, and the polycrystalline silicon gate electrodes 17a and 17b. At the same time, the silicon nitride films 29a and 29b on the sidewall of the gate are removed by the dry etching (FIG. 14A). Herein, a forming step of the nickel silicide 36 is performed as follows. First, nickel (Ni) is deposited to a film thickness of about 5 nm on the semiconductor substrate 10 surface. Subsequently, heat treatment is performed by RTP, for example, at about 300° C. and then, unreacted nickel is removed by persulfate treatment. Thereafter, additional heat treatment is, for example, performed at 400° C. to 500° C. to lower a resistance of the nickel film. Thus, the nickel silicide 36 as shown in FIG. 14A is formed. In place of nickel, cobalt (Co) may be silicided.

Figure 14B:
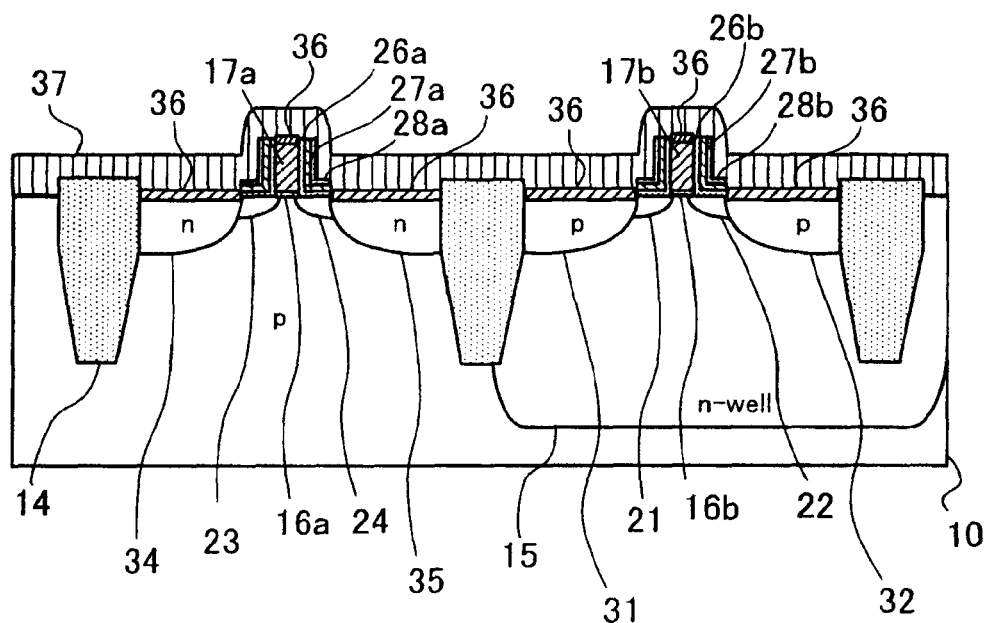

Subsequently, a CESL film 37 as a silicon nitride film having a tensile intrinsic stress is deposited to a thickness of 100 nm by a plasma CVD method (FIG. 14B). The CESL film 37 used at this time has the tensile intrinsic stress of which the absolute value is, for example, 1.5 GPa or more. Further, during the deposition, the film 37 is deposited to have a higher aspect ratio (ratio between the film thickness in the depth direction and that in the lateral direction) of the gate portion.

Figure 15A:
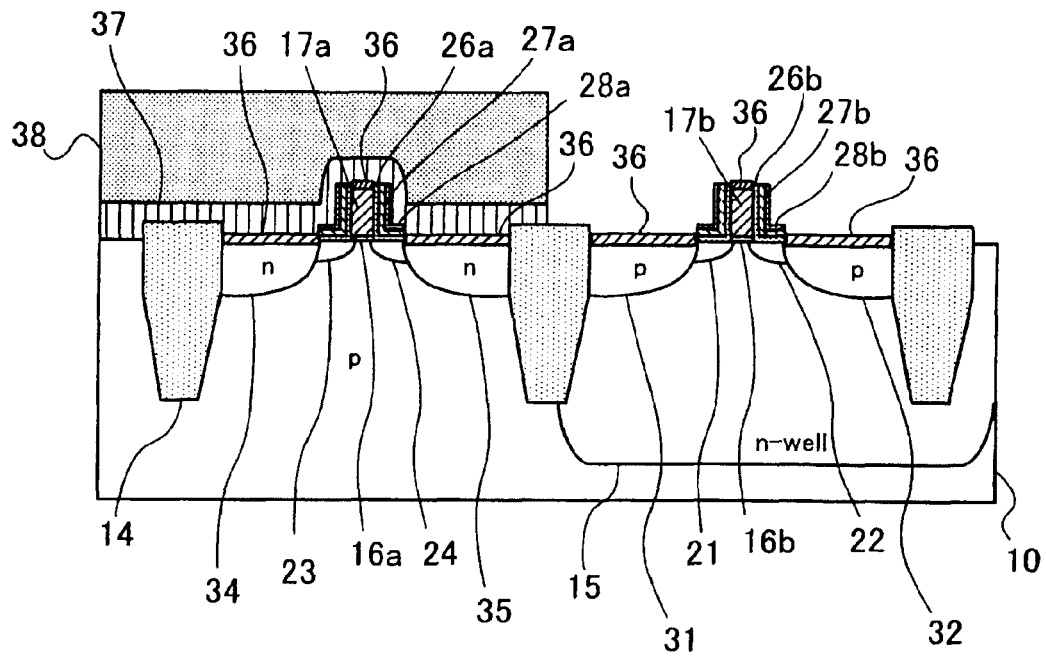
FIGS. 15A and 15B show the manufacturing steps of the semiconductor device of the present embodiment (part 8).
Figure 15B:
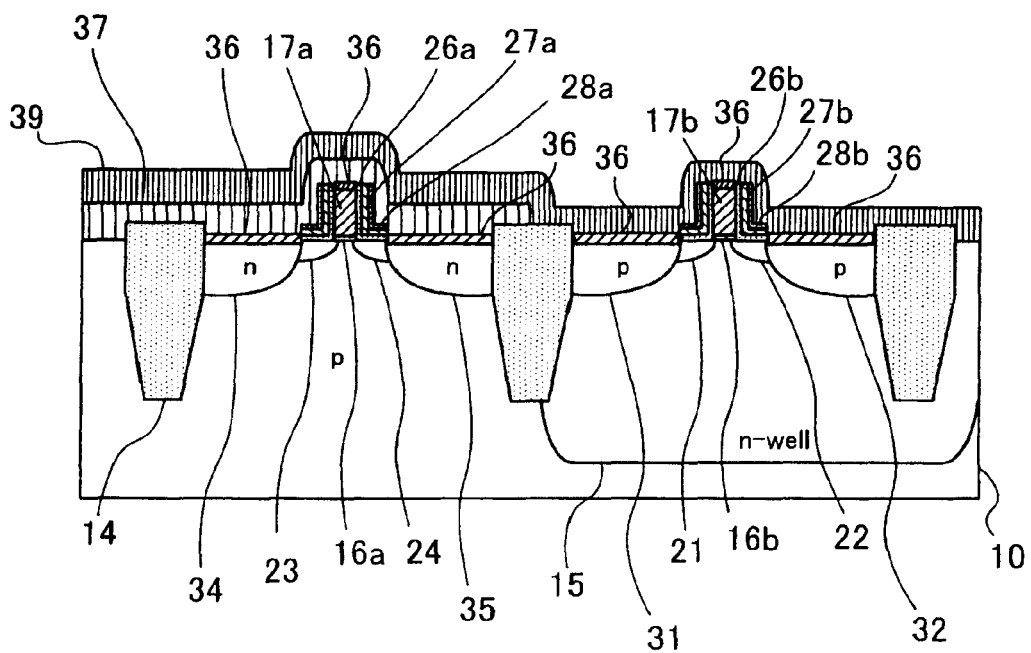

Next, the forming region of the n-channel MOSFET is covered with a photoresist mask 38, and the CESL film 37 in the forming region of the p-channel MOSFET is removed by etching (FIG. 15A). Thereafter, a CESL film 39 as a silicon nitride film having a compressive intrinsic stress is deposited to a thickness of 100 nm by a plasma CVD method (FIG. 15B). The CESL film 39 used at this time has the compressive intrinsic stress of which the absolute value is, for example, 2.5 GPa or more. Further, during the deposition, the film 39 is deposited to have a higher aspect ratio (ratio between the film thickness in the depth direction and that in the lateral direction) of the gate portion.

Figure 16A:
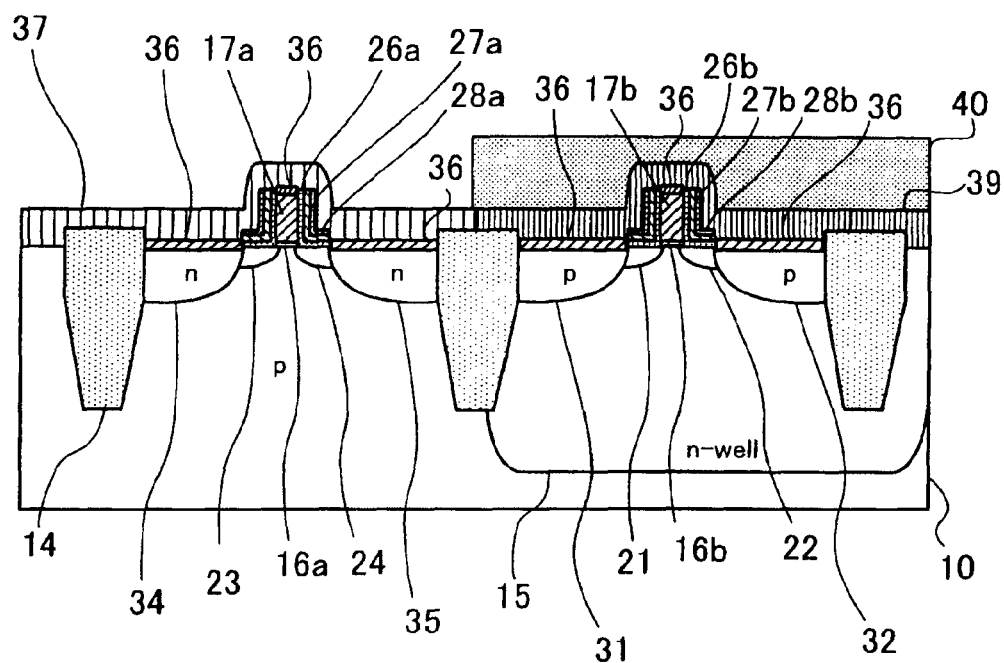
FIGS. 16A and 16B show the manufacturing steps of the semiconductor device of the present embodiment (part 9).

Next, the forming region of the p-channel MOSFET is covered with a photoresist mask 40, and the CESL film 39 in the forming region of the n-channel MOSFET is removed by etching (FIG. 16A). Thereafter, the films 37 and 39 are etched by wet processing using, for example, a hydrofluoric acid solution. In the wet processing, etching is performed by controlling a wetting time such that when a film thickness of the CESL films 37 and 39 is t as well as a target film thickness thereof is T, a wet processing film thickness is t-T. Specifically, when the CESL films 37 and 39 are deposited to a thickness of about 100 nm, the films 37 and 39 are etched by, for example, about 20 nm.

Figure 16B:
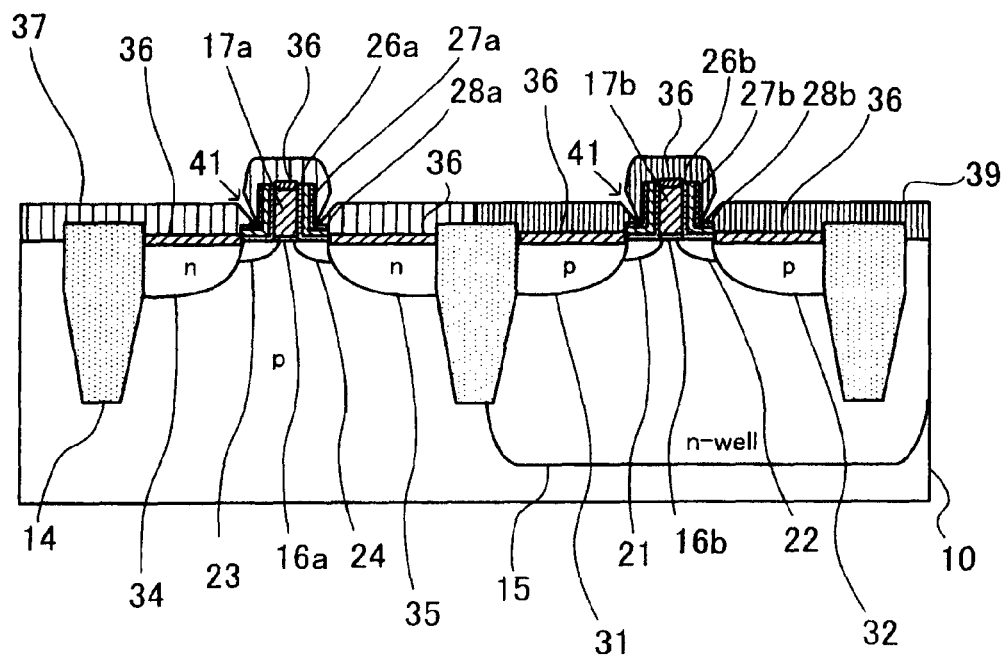

At this time, since each of the CESL films 37 and 39 near the bend sections on the L-shaped sidewalls has a thin film thickness, slits 41 extending near the bend sections of the sidewall insulating layers are formed by etching (FIG. 16B).

Figure 17:
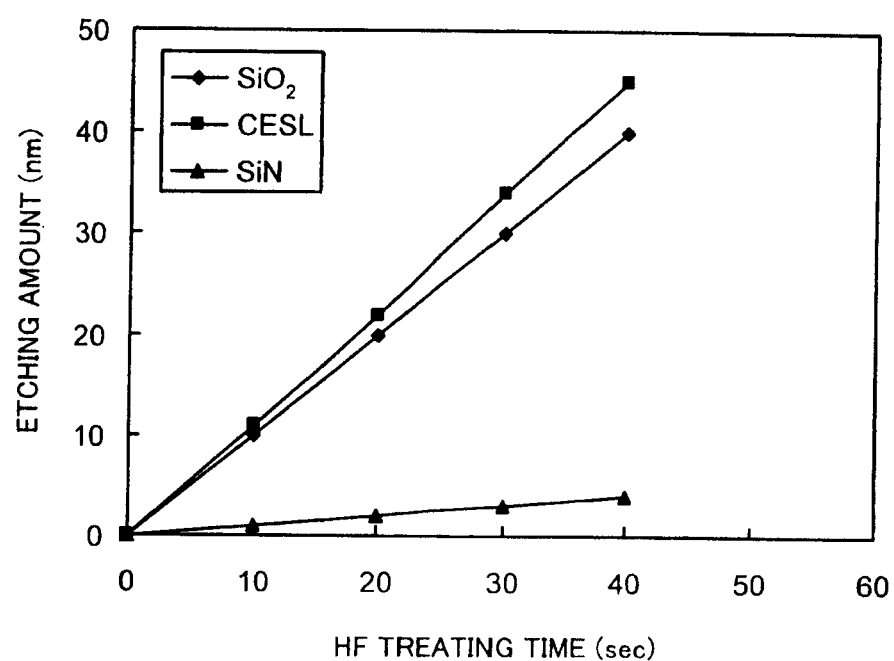
FIG. 17 shows a hydrofluoric acid etching rate of a CESL film, a silicon oxide film and a silicon nitride film.

FIG. 17 shows a hydrofluoric acid etching rate of the CESL film, the silicon oxide film and the silicon nitride film.

The etching rate of the silicon nitride film is as significantly slow as about one tenth to one eighth of the etching rate of the CESL films 37 and 39. Therefore, formation of the slits 41 can be stopped at the L-shaped silicon nitride films 27a and 27b on the gate sidewalls.

Thereafter, known manufacturing steps such as a forming step of an interlayer insulating layer, a normal forming step of contact holes and a normal wiring step are performed to complete the CMOSFET. However, illustration of the manufacturing steps is omitted.

In the CMOSFET formed as described above, a change of the mobility is estimated. The results are as follows.

FIGS. 18A and 18B show the results obtained by comparing the mobility improvement effect between the stress film in which a slit is formed and the stress film in which no slit is formed. FIG. 18A shows the comparison results in the n-channel MOSFET. FIG. 18B shows the comparison results in the p-channel MOSFET.

The stress $\sigma_{LONG}$ in the source-drain direction and the stress $\sigma_{PERP}$ in the channel depth direction are calculated using the strain component estimated by the finite element method. The ratio $\Delta\mu/\mu_0$ between a changed portion $\Delta\mu$ in the mobility due to the addition of strains to the channel and the mobility $\mu_0$ in the case of no addition of strains to the channel is calculated by the above-described formula (1). Herein, the <110> direction is supposed as the channel direction and further, values as shown in FIG. 6 are used as the piezoresistance coefficient.

From these results, the following facts are found. In the n-channel MOSFET, the semiconductor device of the present embodiment using the CESL film 37 in which the slit 41 is formed has a ratio $\Delta\mu/\mu_0$ of 73.38%. Therefore, it is obvious that the device of the present embodiment provides the large improvement effect of the mobility as compared with that (16.02%) using the CESL film 37 in which no slit 41 is formed. Also in the p-channel MOSFET, the semiconductor device of the present embodiment using the CESL film 39 in which the slit 41 is formed has a ratio $\Delta\mu/\mu_0$ of 119.06%. Therefore, it is obvious that the device of the present embodiment provides the large improvement effect of the mobility as compared with that (28.38%) using the CESL film 39 in which no slit 41 is formed.

According to the above-described manufacturing method, in the CESL films 37 and 39 formed on the re-channel MOSFET and the p-channel MOSFET, the slits 41 are formed near the bend sections on the L-shaped sidewalls of the gate. As a result, the stress components in the CESL films 37 and 39 of the source and drain portions can be prevented from being relaxed by the stress components of the gate portion. Therefore, even when using no CESL films 37 and 39 having a large intrinsic stress, a large strain can be imparted to the channel.

Thus, an operating speed of the MOSFET or the CMOSFET can be improved using an inexpensive structure.

Further, in the CESL films 37 and 39, since the gate portion and the source and drain portions are separated by the slits 41, the local stress components can be separated. Therefore, even when using the CESL films 37 and 39 having a relatively large intrinsic stress, the whole film crack due to shrinkage or tension can be avoided.

In the above description, the slits 41 are formed in the CESL films 37 and 39 using the hydrofluoric acid treatment. Alternatively, in the plasma CVD method in the deposition of the CESL films 37 and 39, when the bias is increased to obtain the aspect ratio of 3 or more, the slits 41 can be similarly formed near the bend sections on the L-shaped sidewall insulating layers of the gate. In this case, the slits 41 may be actualized using the hydrofluoric acid treatment. In addition, a state similar to the above can be realized also by forming the polycrystalline silicon gate electrodes 17a and 17b to have the aspect ratio of 3 or more.

In the above description, the silicon nitride films 27a and 27b are used for the sidewall insulating layers. Similarly, silicon carbide insulating film having a high resistance to hydrofluoric acid may also be used.

In the above description, the silicon oxide films 28a and 28b are formed as the top sidewall insulating layers. Similarly, an amorphous silicon film may also be used. Further, the silicon oxide films 28a and 28b may be utterly removed by dry etching after ion implantation into the sources 32 and 34 as well as the drains 31 and 35. In the case of using the amorphous silicon film, the film potentially having conducting properties due to doping may be utterly removed in combination of dry etching and wet etching in order to prevent short circuit between the nickel silicides 36 on the gate and on the source 32 or 34 as well as on the gate and on the drain 31 or 35.

The above description is made by taking as an example the manufacturing steps of the CMOSFET having the L-shaped sidewall insulating layers on the gate. Further, the double-layered sidewall insulating layer structure as shown in FIG. 1 may be adopted.

Figure 19A:
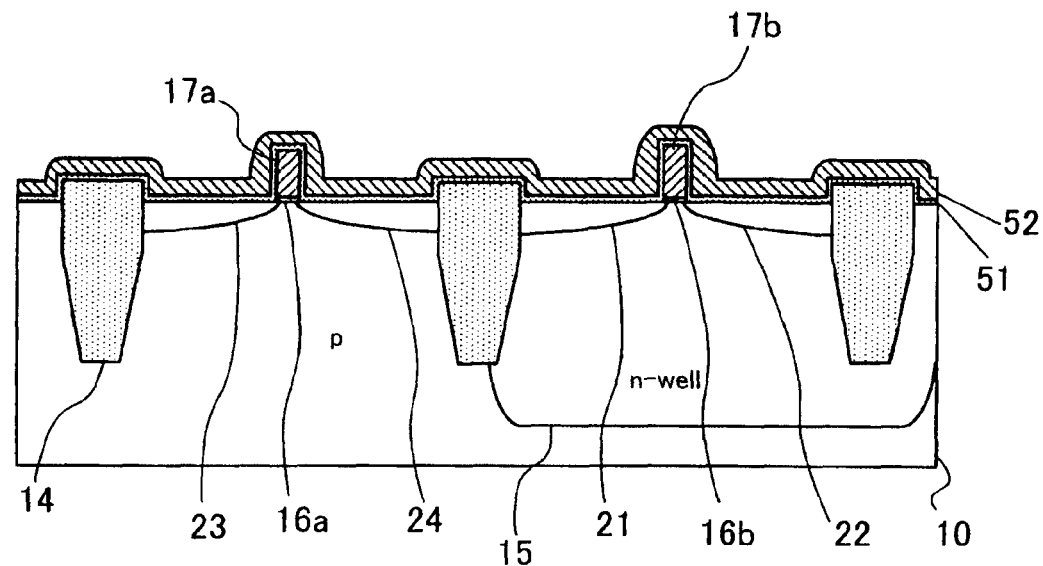
FIGS. 19A and 19B show a part of the manufacturing steps of the CMOSFET having a double-layered sidewall insulating layer structure.
Figure 19B:
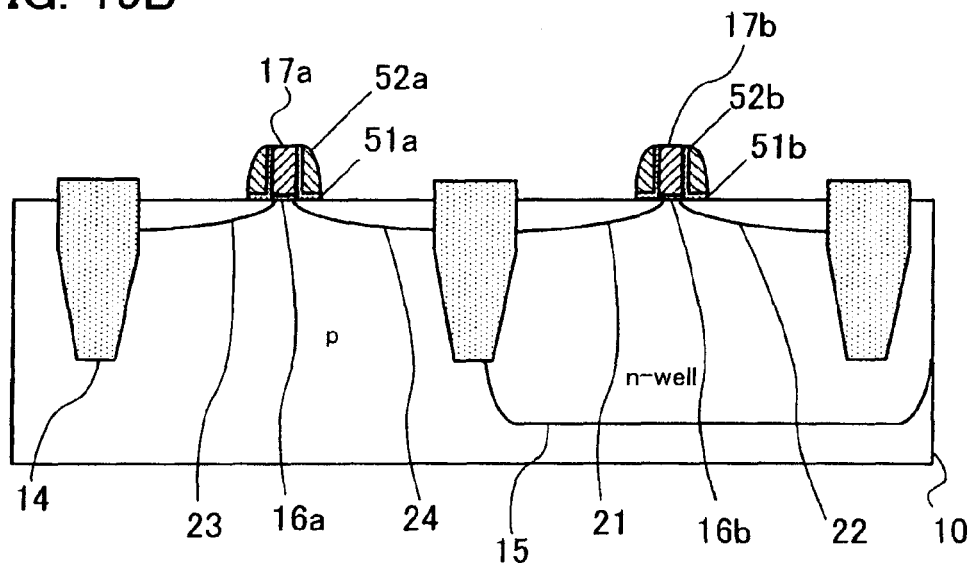

FIGS. 19A and 19B show a part of the manufacturing steps of the CMOSFET having the double-layered sidewall insulating layer structure.

When forming the double-layered sidewall insulating layer structure, the manufacturing steps until FIG. 11C are the same as those in the CMOSFET having the L-shaped sidewall insulating layer structure. Herein, the same elements as those shown in FIG. 11 are indicated by the same reference numerals as those in FIG. 11.

In forming the double-layered sidewall insulating layer structure, the following process is performed. After formation of extensions 21, 22, 23 and 24, a silicon oxide film 51 is deposited, for example, to a thickness of about 5 nm using the thermal CVD method. Further, the silicon nitride film 52 is deposited, for example, to a thickness of about 30 nm using the thermal CVD method (FIG. 19A). Thereafter, etching is performed to form the double-layered sidewall insulating layer structure including on the sidewalls of the polycrystalline silicon gate electrodes 17a and 17b a silicon oxide film 51a and a silicon nitride film 52a as well as a silicon oxide film 51b and a silicon nitride film 52b, respectively (FIG. 19B).

The subsequent manufacturing steps are the same as those from FIG. 13 described above. That is, when the hydrofluoric acid treatment is performed or the aspect ratio in the plasma CVD method or the aspect ratio in formation of the polycrystalline silicon gate electrodes 17a and 17b is made 3 or more, the slits 41 can be formed in the CESL films 37 and 39. In place of using the silicon nitride films 52a and 52b for the sidewall insulating layers, the silicon carbide insulating film may be used.

The present invention comprises the steps of forming the stress film to cover the source, drain, sidewall insulating layer and gate of the MOSFET and forming the slit extending from the stress film surface toward the sidewall insulating layer. Therefore, an effect of allowing the local stress components in the stress films on the source and the drain to be relaxed by local stress components in the stress film on the gate is suppressed by the slit. As a result, a large strain can be imparted to the channel, so that the operating speed of the MOSFET can be improved using an inexpensive structure.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device having a MOS field-effect transistor, comprising:
    forming a gate on a semiconductor substrate,
    forming a source and a drain in the semiconductor substrate,
    forming a sidewall insulating layer that has a first insulating portion formed in a first direction on the source and the drain and a second insulating portion formed in a second direction on a side wall of the gate,
    forming a stress film on the source, the drain, the sidewall insulating layer and the gate; and
    forming in the stress film a slit extending from a surface of the stress film toward the sidewall insulating layer and exposing a bend section of the sidewall insulating layer formed by the first insulating portion and the second insulating portion, wherein the stress film includes a first part and a second part separated by the slit from each other, the first part is located on the gate, and the second part is located on the source and the drain.

2. The manufacturing method according to claim 1, wherein the forming of the slit includes etching the stress film using hydrofluoric acid.

3. The manufacturing method according to claim 1, wherein the slit is formed by forming the stress film such that an aspect ratio of the stress film for covering the gate is 3 or more.

4. The manufacturing method according to claim 1, wherein the slit is formed in the stress film by forming the gate to have an aspect ratio of 3 or more.

5. The manufacturing method according to claim 1, wherein the MOS field-effect transistor includes a p-channel MOS field-effect transistor, the p-channel MOS field-effect transistor includes the gate, the source, the drain and a channel located between the source and the drain, and the stress film applies a compressive stress to the channel.

6. The manufacturing method according to claim 1, wherein the MOS field-effect transistor includes an n-channel MOS field-effect transistor, the n-channel MOS field-effect transistor includes the gate, the source, the drain and a channel located between the source and the drain, the stress film applies a tensile stress to the channel.

7. The manufacturing method according to claim 1, wherein the sidewall insulating layer is formed on the source and the drain, and a shape of the sidewall insulating film is L-shape in cross sectional view.

8. The manufacturing method according to claim 1, wherein only the sidewall insulating layer is exposed at a bottom portion of the slit.

* * * * *